United States Patent [19]
Coteus et al.

[11] Patent Number: 5,863,447
[45] Date of Patent: Jan. 26, 1999

[54] METHOD FOR PROVIDING A SELECTIVE REFERENCE LAYER ISOLATION TECHNIQUE FOR THE PRODUCTION OF PRINTED CIRCUIT BOARDS

[75] Inventors: Paul William Coteus, Yorktown Heights; Stephen Leo Tisdale, Endwell; Alfred Viehbeck, Fishkill, all of N.Y.

[73] Assignee: International Business Machines Corporation, Armonk, N.Y.

[21] Appl. No.: 833,612

[22] Filed: Apr. 8, 1997

[51] Int. Cl.$^6$ ....................................................... B44C 1/22
[52] U.S. Cl. .................................. 216/17; 216/19; 216/20; 428/209
[58] Field of Search ................................. 216/13, 17, 18, 216/19, 20, 39, 56; 29/852; 427/97; 428/209; 205/665, 666, 667, 662

[56] References Cited

U.S. PATENT DOCUMENTS 3,691,632  9/1972  Smith ..................................... 216/20 X
4,853,081  8/1989  Mlynko ................................. 216/17 X Primary Examiner—William Powell
Attorney, Agent, or Firm—Daniel P. Morris

[57] ABSTRACT

This invention describes a new process for the selective isolation of through holes in the production of a multi-layer printed circuit card which allows for substantially smaller holes through reference layers to be built, leading to substantially better electrical isolation of signal traces on adjacent wiring layers, and for substantially improved current carrying capacity in the reference layers. This invention also describes a process to allow reference layers of different thickness from adjacent signal layers, even if they are part of the same 'core'. Several different process flows are disclosed, leading to substantially the same structure but with varying degrees of complexity and quality of the finished product.

6 Claims, 2 Drawing Sheets

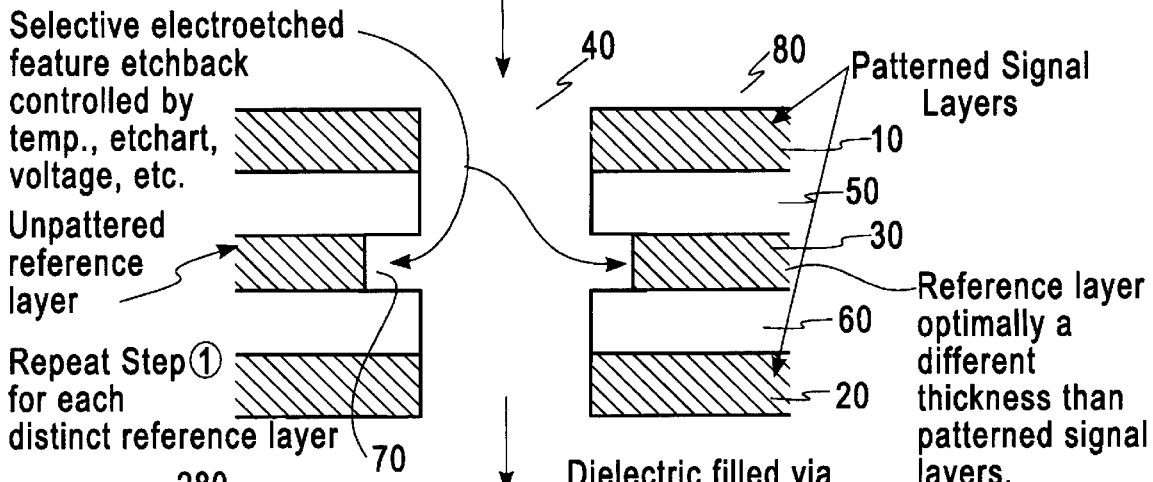

Fig. 1

Drilled Hole (or laser, punched, RIE'ed)

Selective electroetched feature etchback controlled by temp., etchart, voltage, etc.

Unpattered reference layer

Repeat Step ① for each distinct reference layer

Patterned Signal Layers

Reference layer optimally a different thickness than patterned signal layers.

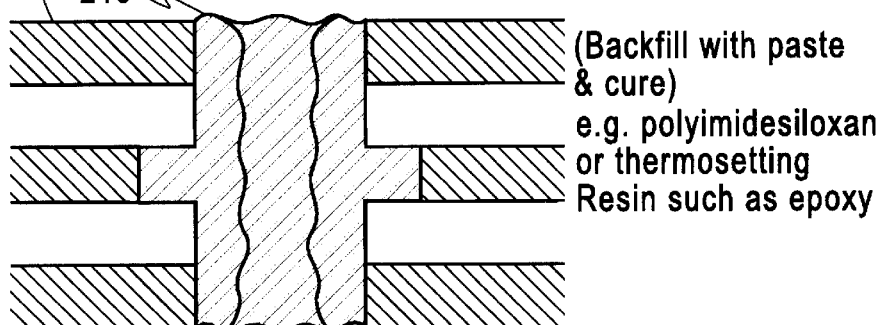

Fig. 2

Dielectric filled via (Backfill with paste & cure) e.g. polyimidesiloxan or thermosetting Resin such as epoxy

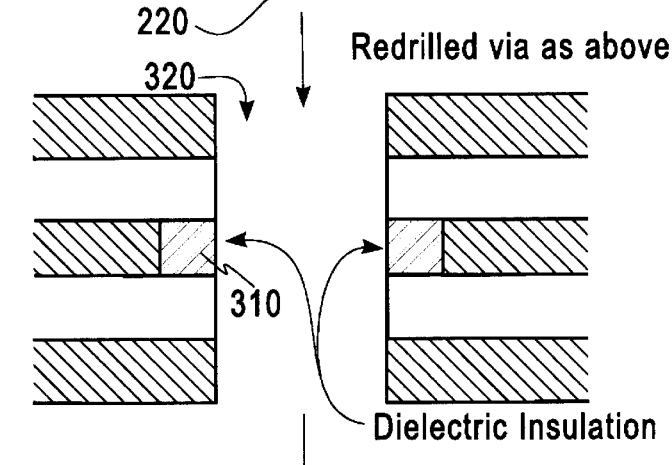

Fig. 3

Redrilled via as above

Dielectric Insulation

Continue Standard Circuitization Process

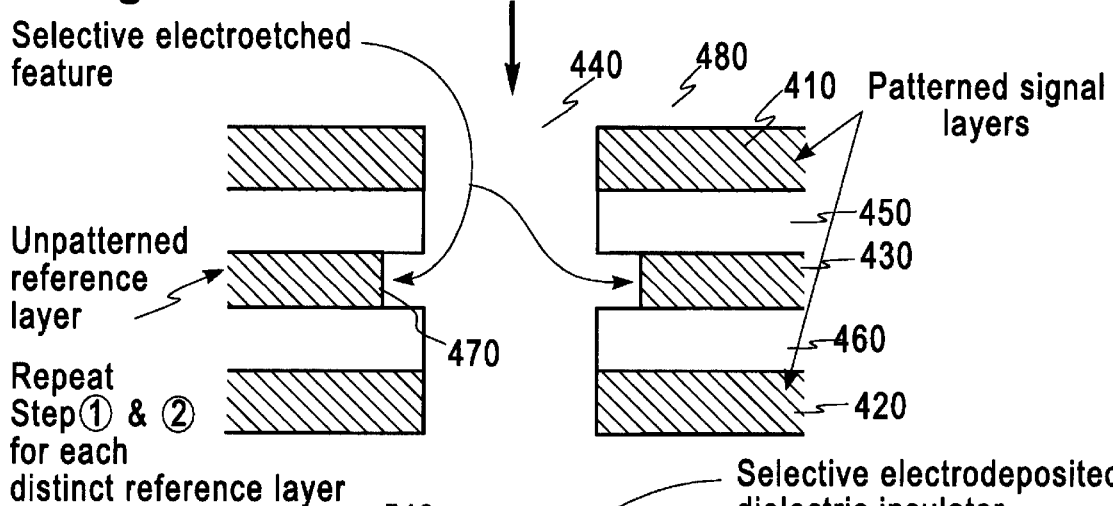
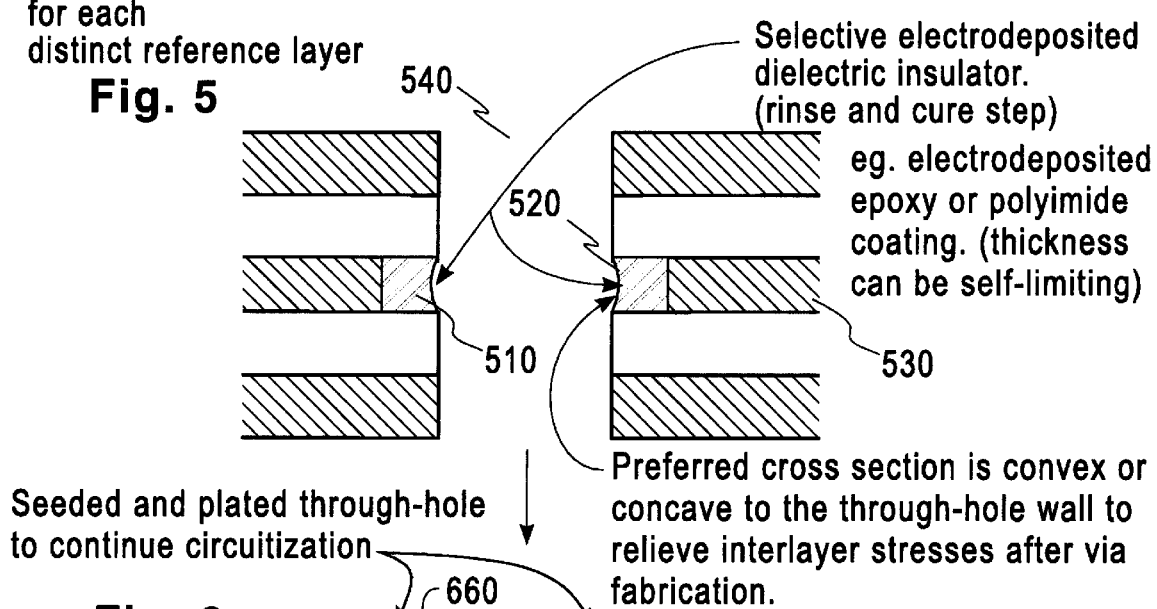
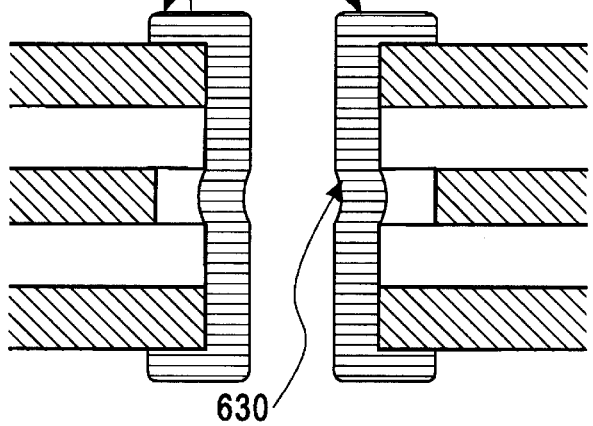

METHOD FOR PROVIDING A SELECTIVE REFERENCE LAYER ISOLATION TECHNIQUE FOR THE PRODUCTION OF PRINTED CIRCUIT BOARDS

FIELD OF THE INVENTION

The present invention is directed to printed circuit boards and methods of fabrication thereof.

BACKGROUND

Multi-layer printed circuit cards are commonplace in the electronics industry. A very important aspect of these circuit cards is the construction of vias, or through-holes, which make contact to one or more of the wiring layers while not making contact to any other layer. These vias connect one layer of the card to another layer, and make possible complex 3 dimensional interconnections.

Typically in such a multi-layer card all wiring layers are patterned first either singly or as both sides of a conductor-dielectric-conductor sandwich (a 'core'); the layers stacked up, and isolated from each other by dielectric layers (a 'fill'), and laminated under heat and pressure into a single card; and finally the through holes drilled and then made conducting by seeding of the walls of the drilled holes and electroplating. Often the outer layers of the card are plated at this time also, so that the conductor thickness of the outer layers is equal to or greater than the thickness of the copper 'barrel' that lines the sides of the drilled hole.

The process of not making contact to an internal or external wiring layer, or layer of selectively patterned electrical conductors, is relatively easy since all that is required is there be no conductor in the area of the board through which the via is to be made. However, many of the layers of a multi-layer circuit card may be almost continuous conductor, with patterned holes in the conductive layer only to avoid contact with vias. These layers are termed reference layers, and carry the constant potential voltages (for example, ground, +5 Volts, etc) that power electronics connected to these circuit cards. It is these patterned holes in reference layers, called either clearance holes or anti-pads in the industry, that is the subject of this invention.

In a densely wired circuit card it is possible to have so many holes in a reference layer in a region of circuit card that there is almost no metal left to conduct currents. For example, in a complex, high resolution circuit card it is not unusual for holes to be drilled on a 0.050 inch grid, with clearance holes of diameter 0.044" in the reference layers. On an adjacent layer, directly above or below this reference layer, there can be as many as 3 circuit lines, each 0.004 inch wide and separated by 0.004 inch, between two such vias. Thus the 0.006" conductor must serve as the reference return of a transmission line for the 3 signals. If the signals are very fast and especially if there is misalignment between the reference layer and the wiring layer, the lack of a substantial reference layer can cause the signals to couple to each other, or 'cross-talk'. Similarly if the clearance holes in reference layers are too large there may not be enough copper to carry the substantial currents consumed by the devices attached to the cards. Similarly if the clearance holes in the reference layers are too large they will not serve to isolate signal wiring on a layer above the reference layer from signal wiring in a layer below, and the two signal layers can couple or 'crosstalk'. Any of these conditions can cause electrical failure.

Smaller clearance holes would solve the problem, but smaller holes cannot be easily constructed due to misalignment between wiring layers, drill wander during drilling, pressure induced motion of region of the circuit card during the process of laminating the layers together, etc. Were smaller clearance holes to be made, the aforementioned errors could cause the drilled hole to contact the reference plane, causing an unwanted connection or 'short' after electroplating of the vias.

A further difficulty in multi-layer circuit card construction is the inability to make circuit cards with different metal thicknesses on different layers. While it is possible to do this to a limited degree, what is generally required is to selectively etch different layers for different times, which is difficult to impossible if the two layers are part of a 'core'.

It is an object of the present invention to provide a printed circuit board (PCB) and a process for making the printed circuit boards with either solid filled and redrilled or electrocoated reference planes.

It is another object of the present invention to provide a process for making printed circuit boards where the holes are filled by a lamination process as follows: Fill material is coated on a carrier film or foil, and dried.

It is another object of the present invention to provide a process and PCB wherein a board and a mask film or foil are both drilled with the pattern of the holes to be plated through and filled.

It is another object of the present invention wherein the holes are deburred, and chemically cleaned.

It is another object of the present invention to provide a process and PCB wherein holes are activated and electrolessly and/or electrolyticly plated, along with both surfaces of the board.

It is another object of the present invention to provide a process and PCB wherein the drilled mask is aligned over the plated through holes in the board and a sheet coated with the fill material is placed over the mask.

It is another object of the present invention to provide a process and PCB wherein the board, mask and fill sheet are placed in a laminating press and vacuum laminated with heat and pressure to force the fill material into the plated through holes, and then to cure the fill material, after which the press is cooled and pressure released.

It is another object of the present invention to provide a process and PCB wherein the board is removed from the press and the mask and fill carrier sheets are peeled from the board.

It is another object of the present invention to provide a process and PCB wherein the fill material nubs, and any filled material which bled between the board and mask, are removed by mechanical abrasion, and/or chemical processes.

It is another object of the present invention to provide a PCB and a processes of circuit card construction with internal reference layers whereby the internal reference layers can have thickness substantially different from the thickness of adjacent signal wiring layers, and where the clearance holes in the reference layer are substantially aligned to the drilled holes.

SUMMARY OF THE INVENTION

It is the object of this invention to describe a new process for the selective isolation of through holes in the production of a multi-layer printed circuit card which allows for substantially smaller holes through reference layers to be built, leading to substantially better electrical isolation of signal traces on adjacent wiring layers, and for substantially improved current carrying capacity in the reference layers. It is further another object of this invention to describe a process to allow reference layers of different thickness from adjacent signal layers, even if they are part of the same 'core'. Several different process flows will be described, leading to substantially the same structure but with varying degrees of complexity and quality of the finished product. Although the process steps and materials are detailed, they are meant only to be examples of a general technique, the teaching of which is meant to cover any such similar structure or process.

BRIEF DESCRIPTION OF THE DRAWINGS

Further objects, features, and advantages of the present invention will become apparent from a consideration of the following description of the invention when read in conjunction with the drawings FIGs. in which:

FIGS. 1 to 3 show a first sequence of steps for forming the structure according to the present invention.

FIGS. 4 to 6 show a second sequence of steps for forming the structure according to the present invention.

DETAILED DESCRIPTION

A solution to this problem of large clearance holes in internal or inter-plane reference layers is to fabricate to create the card stack-up without patterning of the reference layers, and then to pattern the clearance holes using electro-chemical etching after the through vias have been drilled. The clearance holes can be isolated electrically in at least 2 different ways, and the drilled holes then seeded and plated in the standard way.

FIGS. 1–3 shows the steps in the first of two described processes to create a multi-layer circuit card with selective. interplane reference layer isolation. Shown is top conductive layer 10, bottom conductive layer 20, and an internal reference layer 30. Between layer 10 and 30 is dielectric layer 50, and between layers 30 and 20 is dielectric layer 60. It is desired in this instance to have electrical contact using a via 40 between layers 10 and 20, without electrically contacting layer 30. To do so layers 10 and 20 are optional patterned, the layer stack of layers 10,50,30,60,20 constructed into card 80, and the hole 40 drilled. Note an important departure from standard circuit card construction has already been made: the clearance hole for via 40 through conductor 30 has not yet been made.

To make the clearance hole we make use of electrochemical etching, or reverse electro-plating, to selectively remove metal from the reference layer in the vicinity of the drilled hole 40. To do so, after all holes through layer 30 that are not to contact layer 30 have been drilled, one can place the card 80 into a suitable etchant tank, and apply a voltage to the reference layer 30. Electrically assisted etching will remove metal only from the area 70 surrounding the drilled hole to form a non-uniform cross-sectional area through-hole. The size of the resultant clearance ring 70 (undercut-cavity-region) is determined by the reference voltage, temperature, chemical makeup of the etchant, etch time, etc. The thickness of the copper layer 30 is not important, and can be substantially different than the thickness of adjacent layers 10 and 30. This is a departure from standard circuit card practice where a reference layer is often patterned with a signal layer adjacent as part of a copper-dielectric-copper sandwich or 'core'. Note substantial misalignment between layers 10/20 and layer 30 can occur without effecting the quality or size of the clearance ring 70.

If there are more reference layers of the same potential as layer 30, i.e., ground, they can be drilled and electro-etched at the same time. If there are other distinct reference layers, i.e., 5.0 Volts, etc., then these layers must be drilled and electro-etched separately. After all layers are drilled and etched, we can move to the steps of FIGS. 2 and 3. Alternatively we can go through FIGS. 1, 2, and 3 for each reference layer in turn, although this is likely not the most efficient manufacturing flow.

To complete the isolation of layer 30 from via 40, we need to add an insulating dielectric to the exposed copper. FIG. 2 shows a means to isolate the layer 40. What has happened is a dielectric paste 210 has been forced into the hole, excess paste removed from the outsides of card 280 (same as card 80), and the paste cured. The fill may be complete, or a smaller through hole 210 may be left, the result will be the same. Lastly in FIG. 3 the hole is redrilled with the same size drill as drilled hole 40. The cured paste is removed by the drill, leaving only the insulating dielectric ring 310. The hole 320 is substantially aligned with the hole 40 and clearance hole 70 since no metal is drilled and the cured dielectric 210 is preferably softer than the dielectric 50 and 60 between card layers. Thus the drill stays in the soft material, and does not wander into the harder regions of metal or dielectric. At this point the standard card practice of through hole via seeding and electro-plating of the hole 310 can continue as shown in FIG. 6 in regard to the process of FIGS. 4–6.

FIGS. 4 though 6 show an alternative means to create a selectively isolated interplane reference layer. FIG. 4 is identical to FIG. 1, with card elements 410, 420, 430, 440, 450, 460, 470, and 480 of FIG. 4 corresponding to elements 10, 20, 30, 40, 50, 60, 70, and 80 of FIG. 1. However, this time before proceeding to the next distinct reference we use an electro-deposition of a dielectric to fill the void 470 created by the electro-etch. The deposition of material 510 is accomplished by applying a voltage to reference layer 530 and immersing the card 580 in a suitable solution of a dielectric which can be electro-deposited. The thickness of the material 510 can be self limiting, which is very desirable for accurate process control. The deposited material can be now cured to a hardened state and excess, uncured material rinsed away.

If there are more reference layers of the same potential as layer 430, i.e., ground, they can be drilled and electro-etched at the same time. If there are other distinct reference layers, i.e., 5.0 Volts, etc, then these layers must be drilled, electro-etched, electro-deposited with an insulated dielectric, and cured separately. After all layers are drilled and etched, we can move to the steps of FIGS. 6.

In FIG. 6 shows the result of seeding and plating hole 540 (same as hole 440). The result is a plated barrel 660. The shape of the wall 520 can be made optionally concave or convex by control of process parameters and choice of materials, this shape can be very important to reduce inter-layer stress as shown in the feature 630. Again layer 430 can be any thickness, unrelated to layers 410 and 430. The process actually works best for a thick layer 430 which is in stark contrast to traditional circuit card construction which works best for thin metal layers. Since reference layers are often desired to be thick to support large electrical currents and maintain card mechanical stability, this is a very desirable attribute of this process.

Selection criteria for a PTH (plated through hole) fill material include:
  (i) chemical and thermal compatibility with PCB fabrication processes and materials,
  (ii) sufficient flow to fill small, high aspect ratio PTH's,
  (iii) the ability to be transformed into a solid material, with a minimal volume change, after filling, (iv) thermal expansion compatible with the rest of the PCB structure, and (v) have electrodepositing capability.

For filling the PTH, one class of materials which can be formulated to meet these requirements is composed of thermosetting resins. Especially useful are epoxy resins, of the same type used to make the epoxy/glass pre-pregs used for PCB construction. Another material used to fill the PTH would be the polyimidesiloxane class of materials. For electrodepositing an insulating layer, one can also use epoxy or polyimide coatings. PTH's could be filled by dispensing the fill material from a syringe, through a needle, into the holes, but this is time consuming and expensive, and therefore not cost effective. A method for mass filling of the PTH's is required for economical manufacture. The use of a squeegee to force the fill material into the PTH's might appear to be a possible mass fill technique, but it is difficult to get complete fill of high aspect ratio holes. Still, the method holds promise for holes of sufficiently small aspect ratio (ratio of hole diameter to hole length). By utilizing the electrodeposited materials the circuit board need only be dipped into a tank or run through a conveyorized spray tank to allow for the deposition of the material.

The PTH fill method used employs a standard, vacuum laminating press, normally used to laminate multilayer PCB's. The process is as follows: The fill material is coated as a thin layer on a carrier film or foil, and dried and/or partially cured to form an easy to handle, tack-free sheet. The composite, multilayer PCB, with copper foil on the external surfaces, is drilled in the normal manner with the pattern of PTH's which are to be filled.

A masking sheet of metal foil or polymer film is also drilled with the same pattern as the PCB.

The drilled holes are activated and plated with metal using any of the many known processes for making PTH's in PCB's.

The masking sheet is placed over the PCB with the holes aligned to those of the PCB.

A sheet of the foil or film coated with the fill material is placed over the PCB and masking sheet, with the coated side facing the PCB. An alternative useful for higher aspect ratio PTH's that may be more difficult to fill, uses a mask and coated sheet on each side of the PCB.

One or more of the PCB/mask/fill-sheet assemblies is placed in the opening of a vacuum laminating press.

The press cycle is activated, which results in the air being removed from the stack, especially from within the PTH's to be filled, and pressure and heat being applied. The heat causes the viscosity of the fill material to decrease to the point where it will flow, under the force of the applied pressure, into the PTH's. Heating is continued until the time and temperature cycle required to cure the fill material has been completed.

The press is allowed to cool and the PCB(s) with the filled PTH's are removed.

The masking and carrier sheets are carefully peeled away from the PCB, and the PTH fill is now complete.

The PCB with the filled PTH's is not ready for circuitization, however. The fill process leaves raised nubs of fill material at each of the PTH's, and some of the fill material bleeds between the mask sheet and the PCB. The nubs and surface film (from bleed) of the cured fill material must be removed before the PCB can be successfully circuitized. This is accomplished by surface abrasion.

For electro-depositing materials, a simple dip tank with capability to contact each reference level of the PCB is required. The material to be deposited must also be capable of easily flowing through very high aspect ratio drilled through holes so that it can be deposited on the reference layers within the PCB structure.

The PCB panel can now be circuitized with standard print and etch processing as is known in the industry, and subsequent processing completed normally.

The methods described above is used to drill and plate only the PTH's to be filled or electro-coated. The unfilled PTH's are drilled after filling, either before or after the nub and bleed remove operation. The panel can now be circuitized and with standard print and etch processes as above.

The invention as described thus far will provide PCB's with selectively isolated reference layers within the multilayer structures.

By manipulating the process sequences required for selective PTH filling or coating, it is possible to achieve fine line (dense) circuitry capable of very high frequencies. The basic process flow is as follows:

Laminate the PCB, with foil on the external surfaces, using well known methods.

The foil on the surface of the PCB subcomposite may optionally be thinned at this time to facilitate later etching of fine line circuitry.

Drill the holes for the PTH's to be filled, and also drill masking sheet(s) with the same hole pattern.

Selectively electroetch the required reference layers.

Place a masking sheet over the PCB, and align the holes in the sheet with those in the PCB.

Place a sheet of foil coated with the fill material over the masking sheet, with the coating facing the PCB. Optionally, a second mask sheet and coated foil may be placed similarly on the opposite side of the PCB to ease the filling of high aspect ratio holes.

Place one or more of the prepared stacks of PCB, mask and coated foil into the opening of a vacuum laminating press.

Activate the press cycle to remove air from the PTH's, and apply heat and pressure to first force the fill material to flow through the holes in the mask and into the PTH's in the PCB, and then to cure the fill material into a solid.

Remove the PCB(s) with filled PTH's from the press and peel off the masking sheets and carrier foils.

Abrasive and/or chemical nub and bleed removal may optionally be done at this point.

Drill the holes for the unfilled PTH's and re-drill the filled PTH's.

Clean the holes using abrasive and/or chemical means to allow plating of the unfilled holes. This step may also serve as the nub and bleed removal step if it was not done previously.

Activate and plate the holes (and surfaces of the PCB) using any of the known processes for PTH's.

Circuitize the PCB using known print and etch methods.

The PCB can then be finished as desired using known processes.

EXAMPLE

The following presents one specific realization of the invention, but many variations are possible within the scope of the invention.

Copper foil (1 oz/ft$^2$) is coated with a composition containing 20 to 30% by weight of epoxy resin and 70 to 80% by weight of copper powder using known film coating methods. Methyl ethyl ketone is used as a solvent in sufficient quantity to achieve a mix viscosity suitable for the coating method chosen. The epoxy resin is of the phenol cured cresol-novolac type and is catalyzed with a tertiary amine. The copper powder has a particle size distribution of six micrometers and smaller.

The coating is then heated to remove the majority of the solvent and produce a tack free surface. The dried coating thickness is in the range of 0.002 to 0.006 inches.

The PCB subcomposite is laminated using known methods with copper foil (½ oz/ft$^2$) on both sides.

The surfaces of the subcomposite are then vapor (grit) blasted to remove epoxy residues from the lamination process.

The external copper foil is thinned by etching to a thickness of about 0.00025 inch.

The holes for the PTH's to be filled are drilled.

A sheet of polyimide foil is drilled with the same hole pattern.

The subcomposite is then processed through a mechanical deburring operation.

The drilled polyimide foil is placed over the plated subcomposite, and the holes aligned. A sheet of the coated foil, prepared above, is placed on top of the polyimide foil.

The subcomposite and two foils are placed in a vacuum laminating press, vacuum pulled, and heat and pressure applied. The heat and pressure first cause the coating on the foil to soften and flow through the holes in the polyimide foil into the PTH's in the subcomposite. Further heating causes the epoxy of the fill material to cure into a rigid matrix. When the cure is complete the press is cooled, pressure released, and the subcomposite removed from the press.

The copper and polyimide foils are then carefully peeled away from the subcomposite, which now has filled PTH's.

The surface of the subcomposite is mechanically abraded to remove the nubs of fill material from the tops of the PTH's, and any fill material residues on the surface of the copper due to bleed between the polyimide mask and the subcomposite.

The subcomposite is drilled with the pattern of holes for the PTH's which are to remain unfilled, as well as re-drilling the filled PTH's.

The circuit board is then processed through a mechanical deburring operation and then a chemical hole cleaning operation to prepare the hole barrels for plating.

The circuit board is seeded with the palladium/tin colloidal suspension, and electrolessly or electrolytically plated.

The structure is pumice scrubbed, a photoresist is applied, exposed and developed in the pattern of the circuitry desired.

The surface copper etched in cupric chloride to form the actual circuit patterns. The thickness of the copper etched is about 0.0014 to 0.0018 inches, which facilitates the etching of fine lines and spaces.

The photoresist is chemically removed.

The PCB composite may now be additionally processed to provide gold or tin/lead plated features, solder masks, and the like.

While the present invention has been described with respect to preferred embodiments, numerous modifications, changes, and improvements will occur to those skilled in the art without departing from the spirit and scope of the invention.

We claim:

1. A method comprising:

providing a substrate;

said substrate has a plurality of metal layers with dielectric layers therebetween;

said substrate has at least one through-hole at least extending into said substrate through at least one of said metal layers;

exposing said substrate to an etching medium;

applying a voltage to at least one of said metal layers to have a voltage biased metal layer;

said voltage-biased metal layer is etched by said etching mediums to result in a non-uniform cross-sectional area through-hole wherein said voltage-biased metal layer in the vicinity of said through-hole has a larger cross-sectional area than adjacent dielectric layers on either side thereof to form an undercut-cavity-region;

said non-uniform cross-sectional area through-hole has a sidewall;

inserting into said non-uniform cross-sectional area a dielectric material to at least fill said undercut-cavity region.

2. A method according to claim 1, further including coating said sidewall with an electrical conductor to electrically interconnect at least two of said plurality of metal layers.

3. A method comprising:

providing a substrate;

said substrate has a plurality of metal layers with dielectric layers therebetween;

said substrate has at least one through-hole at least extending into said substrate through at least one of said metal layers;

exposing said substrate to an etching medium;

applying a first voltage to at least one of said metal layers to have a voltage biased metal layer;

said voltage-biased metal layer is etched by said etching mediums to result in a non-uniform cross-sectional area through-hole wherein said voltage-biased metal layer in the vicinity of said through-hole has a larger cross-sectional area than adjacent dielectric layers on either side thereof to form an undercut-cavity-region;

said non-uniform cross-sectional area through-hole has a sidewall;

exposing said substrate to an electro-depositing dielectric medium;

applying a second voltage to said at least one of said metal layers to electro-depositing said dielectric medium into said undercut-cavity-region.

4. A method according to claim 3, further including coating said sidewall with an electrical conductor to electrically interconnect at least two of said plurality of metal layers.

5. A structure comprising:

a substrate;

said substrate has a plurality of metal layers with a dielectric layer therebetween;

at least one through-hole at least extending into said substrate;

said through-hole has a non-uniform cross-sectional area;

at least one of said plurality of metal layers has an undercut-cavity-region;

said at least one metal layer being coated with a dielectric layer at said undercut-cavity-region.

6. A structure according to claim 5, further including an electrically conductive material at least coating said sidewall and electrically interconnecting at least two of said plurality of electrically conductive layers and being electrically isolated from said at least one of said plurality of metal layers.

* * * * *